US007336305B2

(12) United States Patent
Suzuki

(10) Patent No.: US 7,336,305 B2
(45) Date of Patent: Feb. 26, 2008

(54) SOLID-STATE IMAGE CAPTURING DEVICE, SMEAR CORRECTING METHOD THEREOF AND DIGITAL STILL CAMERA USING THE SAME

(75) Inventor: Nobuo Suzuki, Miyagi (JP)

(73) Assignee: FUJIFILM Corporation, Tokyo (JP)

( * ) Notice: Subject to any disclaimer, the term of this patent is extended or adjusted under 35 U.S.C. 154(b) by 560 days.

(21) Appl. No.: 10/315,978

(22) Filed: Dec. 11, 2002

(65) Prior Publication Data

US 2003/0107662 A1 Jun. 12, 2003

(30) Foreign Application Priority Data

Dec. 11, 2001 (JP) ............................ P.2001-377044

(51) Int. Cl.
*H04N 9/64* (2006.01)
*H04N 3/14* (2006.01)

(52) U.S. Cl. ....................................... 348/249; 348/315

(58) Field of Classification Search ................ 348/248, 348/249, 250
See application file for complete search history.

(56) References Cited

U.S. PATENT DOCUMENTS

| | | | | |
|---|---|---|---|---|
| 4,578,707 A | * | 3/1986 | Ozawa et al. ................ | 348/248 |
| 4,602,289 A | * | 7/1986 | Sekine ........................ | 348/315 |
| 5,282,041 A | * | 1/1994 | Tani et al. ................... | 348/299 |
| 6,356,305 B1 | * | 3/2002 | Akagawa ..................... | 348/311 |
| 6,583,818 B1 | * | 6/2003 | Toma .......................... | 348/312 |
| 6,798,450 B2 | * | 9/2004 | Baer .......................... | 348/248 |
| 2001/0024237 A1 | * | 9/2001 | Osada et al. ................. | 348/273 |

FOREIGN PATENT DOCUMENTS

JP          10-136391 A        5/1998

* cited by examiner

*Primary Examiner*—Lin Ye
*Assistant Examiner*—Dillon Durnford-Geszvain
(74) *Attorney, Agent, or Firm*—Birch, Stewart, Kolasch & Birch, LLP

(57) ABSTRACT

In a solid-state image capturing device 100 comprising pixel arrays 11*r*, 11*g* and 11*b* arranged in a row direction and a column direction which is orthogonal thereto and a vertical register 12 including a plurality of transfer electrodes in which a signal charge generated by light acceptance of each pixel is read and is sequentially transferred in the column direction upon receipt of a transfer pulse, an electrode terminal for generating K (K is an integer of 2 or more) continuous electric potential wells for a signal charge in the vertical register 12 upon receipt of the transfer pulse and an electrode terminal for generating one electric potential well for a smear charge after the K electric potential wells for a signal charge are provided as electrode terminals 101 to 116 for cyclically transmitting the transfer pulse to each of the transfer electrodes. By providing a large number of electrode terminals and applying a transfer pulse for multiphase driving to each of the electrode terminals, it is possible to generate a well dedicated to smear charge transfer.

34 Claims, 10 Drawing Sheets

SOLID-STATE IMAGE CAPTURING DEVICE, SMEAR CORRECTING METHOD THEREOF AND DIGITAL STILL CAMERA USING THE SAME

This nonprovisional application claims priority under 35 U.S.C. § 119(a) on Patent Application No. p. 2001-377044 filed in Japan on Dec. 11, 2002, which is herein incorporated by reference.

BACKGROUND OF THE INVENTION

1. Field of the Invention

The present invention relates to a digital still camera having an electronic shutter function, and more particularly, to a solid-state image capturing device for carrying out smear correction without deteriorating an image resolution according to the number of pixels of a solid-state image capturing device, a smear correcting method and the digital still camera.

2. Description of the Related Art

FIG. 9(a) is a schematic plan view showing a conventional solid-state image capturing device described in JP-A-10-136391 proposed by the applicant. In a solid-state image capturing device 10, a photoreceptor group in which a photoreceptor 11b having a blue filter attached thereto and a photoreceptor 11r having a red filter attached thereto are arranged alternately and transversely in a line and a photoreceptor group in which a photoreceptor 11g having a green filter attached thereto is arranged transversely in a line are shifted by a ½ pitch and are alternately arranged in a vertical direction.

In the drawing, the photoreceptors 11r, 11g and 11b are displayed in squares inclined by 45 degrees. In the solid-state image capturing device, a transfer electrode 16 is provided along each side of the squares of the photoreceptors 11r, 11g and 11b. A transverse line H1 of the transfer electrodes is divided by a channel stop to correspond to each photoreceptor and the same electric potential is applied to the electrode group H1 in a transverse line in the same timing.

In the conventional example, 4-phase driving is carried out. Therefore, the electrode group in a transverse line repeats H3, H4, H1 and H2, and an electrode terminal 21 is connected to the electrode group H1, an electrode terminal 22 is connected to the electrode group H2, an electrode terminal 23 is connected to the electrode group H3 and an electrode terminal 24 is connected to the electrode group H4.

The transfer electrode 16 provided around each of the photoreceptors 11r, 11g and 11b also forms a line in a vertical direction and a transfer electrode group 12 arranged in the vertical direction (only one column is shown in a dotted line) constitutes a vertical register 12. When a read potential is applied to a read gate which is not shown in order to read an image signal picked up by the solid-state image capturing device (the accepted charge of each of the photoreceptors 11r, 11g and 11b), the accepted charge (signal charge) of each of the photoreceptors 11r, 11g and 11b is read to the transfer electrode of the vertical register 12 as shown in an arrow on each of the photoreceptors 11r, 11g and 11b.

By sequentially applying a transfer potential (a transfer pulse) to each of the electrode terminals 21 to 24, then, the accepted charge is transferred in a vertical direction (a downward direction in an example shown in the drawing) and the signal charge is transferred to a horizontal register 13 provided in a lowermost stage through a transfer electrode 17. The signal charge is transferred in a horizontal direction by applying the transfer pulse to electrode terminals 25 and 26 and is output from an output section 14 of the horizontal register 13 as shown in an arrow 27.

FIG. 9(b) is a view showing the transfer state of the vertical register 12. An encircled numeral in the drawing represents a lower figure of the reference numerals of the electrode terminals 21 to 24 (corresponding to FIGS. 1 to 4 of the electrode groups H1 to H4 in a transverse line of FIG. 9(a)). By cyclically applying a transfer potential (for example, a pulse having a high level of 0V and a low level −8V) to each electrode terminal, an electric potential well is moved along the vertical register 12 and signal charges Qi, Qi−1, . . . constituting an image signal are transferred to the horizontal register 13.

The transfer is carried out by repeating such a control that ① an electric potential having a high level is applied to the electrode terminal 21 to expand the electric potential well into three electrodes, ③ the electric potential of the electrode terminal 23 is set to be an electric potential having a low level to reduce the well into two electrodes, and ② the electric potential of the electrode terminal 22 is set to be an electric potential having a high level to expand the electric potential well into three electrodes, . . . from the state shown in the drawing.

In the case in which an image is to be picked up at a high shutter speed by means of a digital still camera mounting a solid-state image capturing device thereon, an electronic shutter is used in place of a mechanical shutter. More specifically, when a signal charge is being transferred by the vertical register 12, the photoreceptor is set in such a state as not to be shielded by the mechanical shutter.

For this reason, a light or an electron leaks out of the photoreceptors 11r, 11g and 11b to the vertical register 12 during the transfer of a signal charge through the vertical register 12, and smear charges qi, qi−1, . . . which are the cause of smear (a bright line in a vertical direction appearing in an image when the sun is photographed) enters the electric potential well in addition to original signal charges Qi, Qi−1, . . . and are transferred together with the signal charge. When the smear charge and the signal charge of an image signal are mixed as shown in FIG. 9(b), there is a problem in that both of them cannot be distinguished from each other, resulting in a deterioration in picture quality.

If it is possible to detect the degree of the smear charge in the electric charges thus transferred, the smear can be decreased by correcting the amount of electric charges which are transferred. In the example of the transfer shown in FIG. 9(b), a progressive scanning type is used. Therefore, it is impossible to distinguish the smear charge from the signal charge. If an interlace scanning type is used, the smear charge can be distinguished from the signal charge.

FIG. 10(a) is a schematic plan view showing a solid-state image capturing device 20 of the interlace scanning type. The solid-state image capturing device 20 has different electrodes 21 to 24 and connecting structures thereof from those of the solid-state image capturing device 10 shown in FIG. 9(a). In the solid-state image capturing device 20, an electrode group H3a arranged horizontally is connected to an electrode terminal 3a, an electrode group H4 is connected to an electrode terminal 4, an electrode group H1b is connected to an electrode terminal 1b, an electrode group H2 is connected to an electrode terminal 2, an electrode group H3b is connected to an electrode terminal 3b, and an electrode group H1a is connected to an electrode terminal 1a.

FIG. 10(*b*) is a view illustrating the transfer of the interlace scanning type. In the interlace scanning type, a signal charge received by a photoreceptor group is read every horizontal line and is thus transferred by the vertical register 12 so that a vacant well is transferred every horizontal line differently from progressive scanning. The signal charge does not enter the vacant well but the smear charge enters the vacant well and is thus transferred. By detecting the amounts of the smear charges qi+1 and qi−1 in the vacant well, therefore, it is possible to estimate the degree of the smear charge qi transferred together with the signal charge Qi by averaging the amounts of the smear charges qi+1 and qi−1, for example.

In the interlace scanning type, thus, the smear charge amount in the image signal can be estimated. By carrying out smear correction, therefore, it is possible to generate an image having less smear. Because of the interlace scanning, however, there is a problem in that the vertical resolution of an image is reduced to a half as compared with the number of pixels.

SUMMARY OF THE INVENTION

It is an object of the invention to provide a solid-state image capturing device of a progressive scanning type which can carry out smear correction without deteriorating an image resolution corresponding to the number of pixels, a smear correcting method and a digital still camera.

The object can be achieved by a solid-state image capturing device comprising a pixel array arranged in a row direction and a column direction which is orthogonal thereto, a vertical register including a plurality of transfer electrodes in which a signal charge generated by light acceptance of each pixel is read and is sequentially transferred in the column direction upon receipt of a transfer pulse, a horizontal register for receiving the signal charge transferred by the vertical register and transferring the signal charge in a horizontal direction, and an output section for outputting the signal charge transferred by the horizontal register, wherein an electrode terminal for generating K (K is an integer of 2 or more) continuous electric potential wells for a signal charge in the vertical register upon receipt of the transfer pulse and an electrode terminal for generating one electric potential well for a smear charge after the K electric potential wells for a signal charge are provided as electrode terminals for cyclically transmitting the transfer pulse to each of the transfer electrodes.

By such a structure, it is possible to provide a vacant well for transferring only a smear charge in addition to an electric potential well for cyclically applying a transfer pulse to electrode terminals provided corresponding to the number of multiphase driving operations of the vertical register and progressively transferring a signal charge accepted by a photoreceptor. Consequently, it is possible to guess a smear component included in the signal charge from a smear charge amount. Thus, it is possible to correct the signal charge to generate an image having smear reduced.

In the foregoing, preferably, the solid-state image capturing device is characterized by selecting means for switching a first mode in which the electric potential well for a smear charge is generated to transfer the signal charge by means of the vertical register and a second mode in which the electric potential well for a smear charge is not generated but the signal charge is transferred by means of the vertical register. By such a structure, in the case in which the smear correction is not required, the signal charge is transferred without providing the electric potential well for a smear charge. Consequently, high-speed transfer can be carried out.

In the foregoing, preferably, the solid-state image capturing device is characterized in that the solid-state image capturing device is an interline transfer type CCD area image sensor or a frame interline transfer type CCD area image sensor, and furthermore, the pixel array is arranged like a tetragonal grid or a honeycomb. The invention can be applied irrespective of the type of the CCD image sensor.

The object can be achieved by a smear correcting method of the solid-state image capturing device, wherein a smear component in a signal charge transferred by the electric potential well for a signal charge from a smear charge amount transferred by the electric potential well for a smear charge is estimated to correct the signal charge. In the foregoing, preferably, the smear correcting method of the solid-state image capturing device is characterized in that each signal charge of the K continuous electric potential wells for a signal charge interposed between two electric potential wells for a smear charge is corrected by averaging each of smear charge amounts of the two electric potential wells for a smear charge. By such a structure, the smear correction can be carried out with high precision so that an excellent image can be obtained.

A digital still camera capable of achieving the object comprises the solid-state image capturing device, an optical system for forming an object image in the solid-state image capturing device, a signal processing section for processing a signal output from the output section of the solid-state image capturing device and generating an image, a memory section for recording the image thus generated, and a smear correcting section for correcting the signal charge by the smear correcting method. By such a structure, it is possible to obtain an excellent image having smear reduced also when a high-speed shutter is released by an electronic shutter.

A digital still camera capable of achieving the object comprises the solid-state image capturing device, an optical system for forming an object image in the solid-state image capturing device, a mechanical shutter for shielding a light of the optical system, a signal processing section for processing a signal output from the output section of the solid-state image capturing device and generating an image, a memory section for recording the image thus generated, a smear correcting section for correcting the signal charge by the smear correcting method and then causing the signal processing section to generate an image, and control means for causing the signal processing section to generate an image from a signal charge obtained when shielding a light by using the mechanical shutter without utilizing the smear correcting section for the same signal charge and for causing the smear correcting section to smear correct the signal charge and causing the signal processing section to generate an image when obtaining the signal charge by an electronic shutter without using the mechanical shutter. By such a structure, the smear correction is carried out when the high-speed shutter is released by the electronic shutter, and the smear correction is not required when the mechanical shutter is released. Therefore, it is possible to generate an image without carrying out the smear correction.

In the foregoing, preferably, the digital still camera is characterized by control means for outputting a transfer pulse to sweep an unnecessary signal charge in the vertical register of the solid-state image capturing device at a high speed immediately before the signal charge is read from the pixel array to the transfer electrode constituting the vertical register. By transmitting a high-speed transfer pulse for sweeping to the transfer electrode, it is possible to more reduce an unnecessary component in the signal charge.

DESCRIPTION OF THE PREFERRED EMBODIMENTS

An embodiment of the invention will be described below with reference to the drawings.

Figure 1:
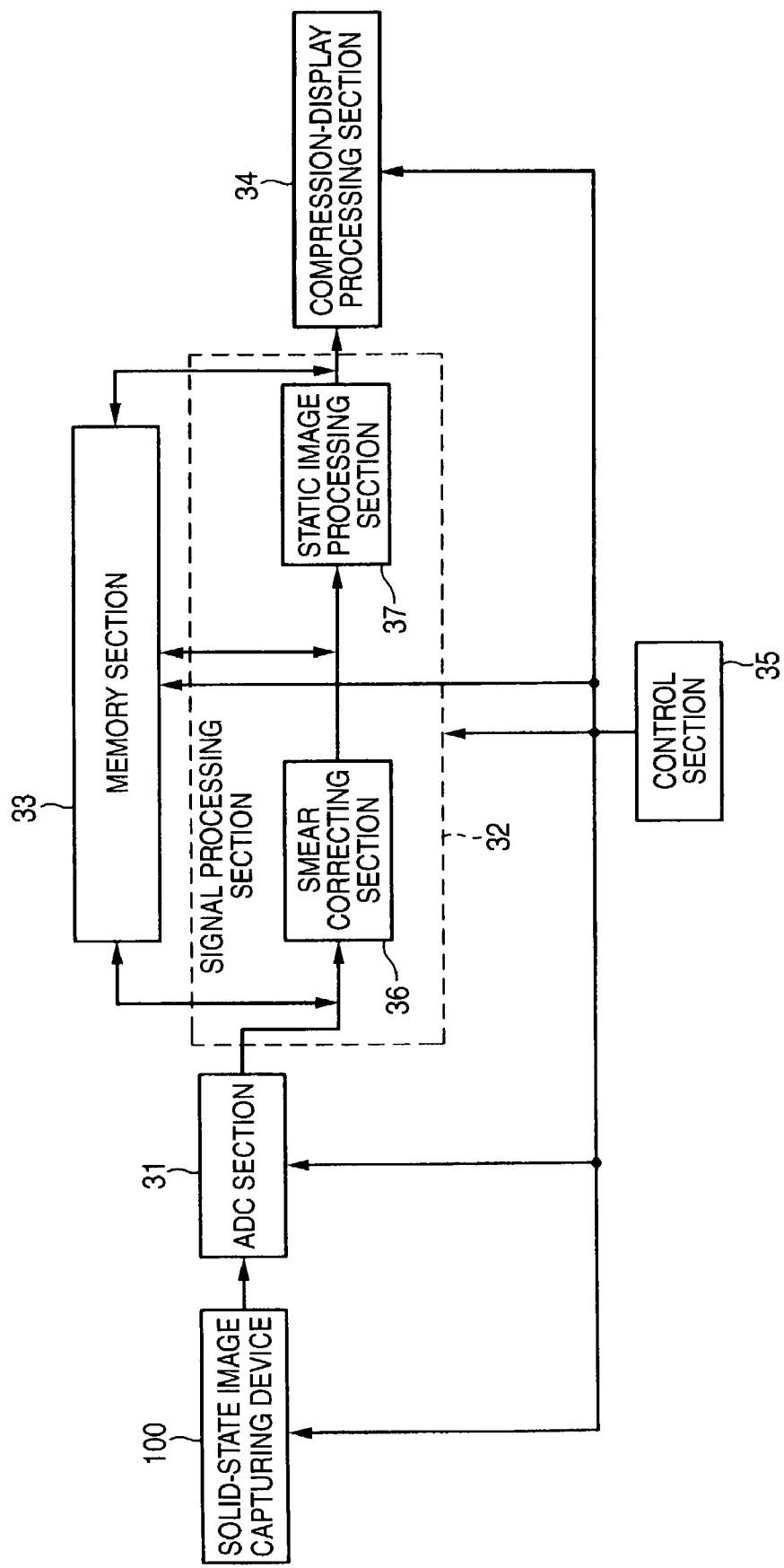
FIG. 1 is a diagram showing the structure of a digital still camera according to a first embodiment of the invention.

FIG. 1 is a diagram showing the schematic structure of a digital still camera according to a first embodiment of the invention. The digital still camera comprises a solid-state image capturing device 100 including a CCD, an AD converting section 31 for converting an analog image signal read from the solid-state image capturing device 100 into a digital image signal, a signal processing section 32 for processing the digital image signal, a memory section 33 for storing the image signal, a compression displaying section 34 for compressing and displaying the image signal thus processed and a control section 35 for controlling them, and the signal processing section 32 includes a smear correcting section 36 and a static image processing section 37.

There are various types of digital still cameras serving to store a digital image signal which has not been subjected to smear correction in the memory section 33, to store a digital image signal obtained after the smear correction and before a static image processing in the memory section 33 and to store the digital image signal obtained after the static image processing in the memory section 33. An optical system for forming an object image in the solid-state image capturing device 100 is provided in the first stage of the solid-state image capturing device 100, in which a mechanical shutter can also be provided.

Figure 2:
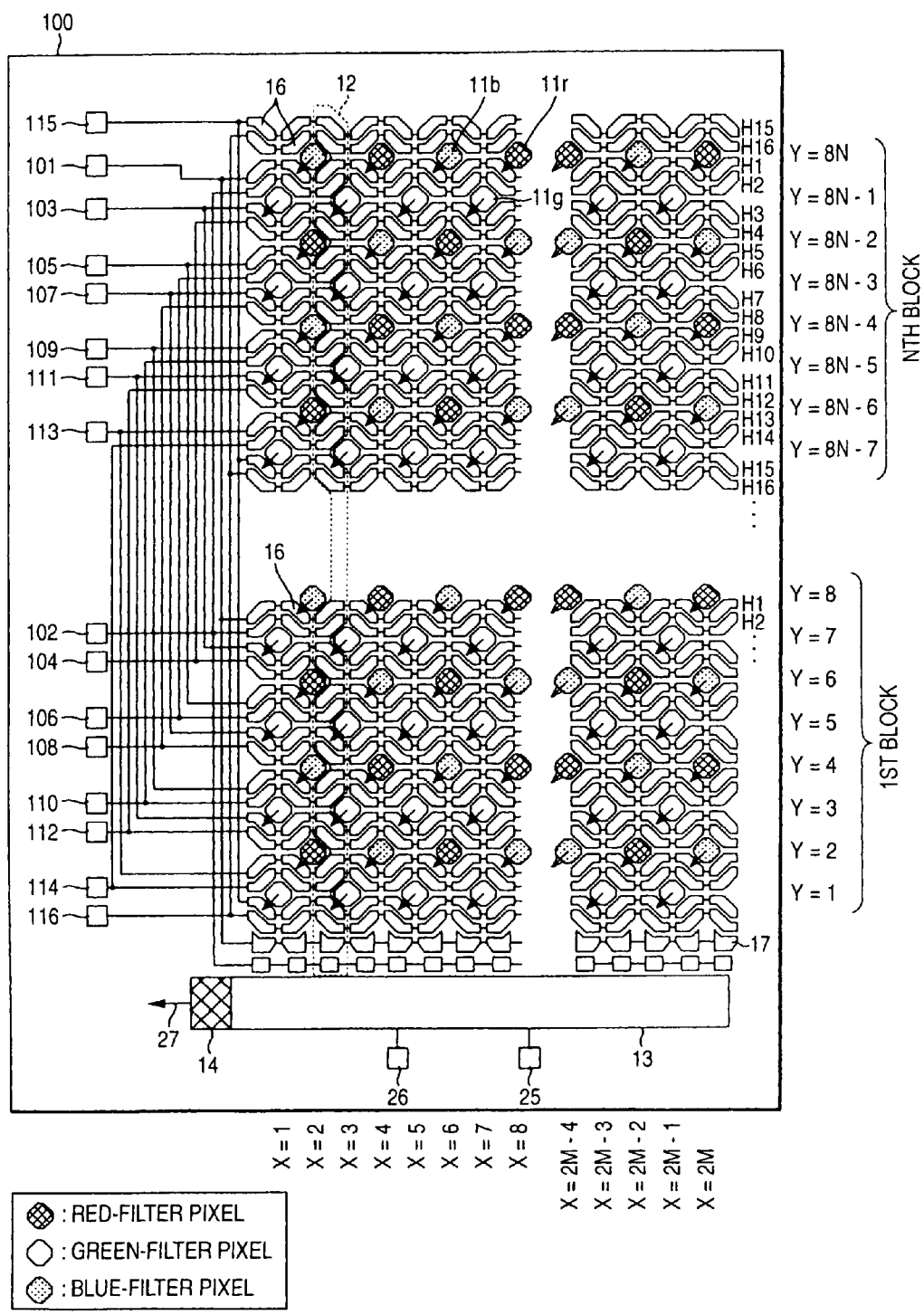
FIG. 2 is a schematic plan view showing a solid-state image capturing device illustrated in FIG. 1.
Figure 9:
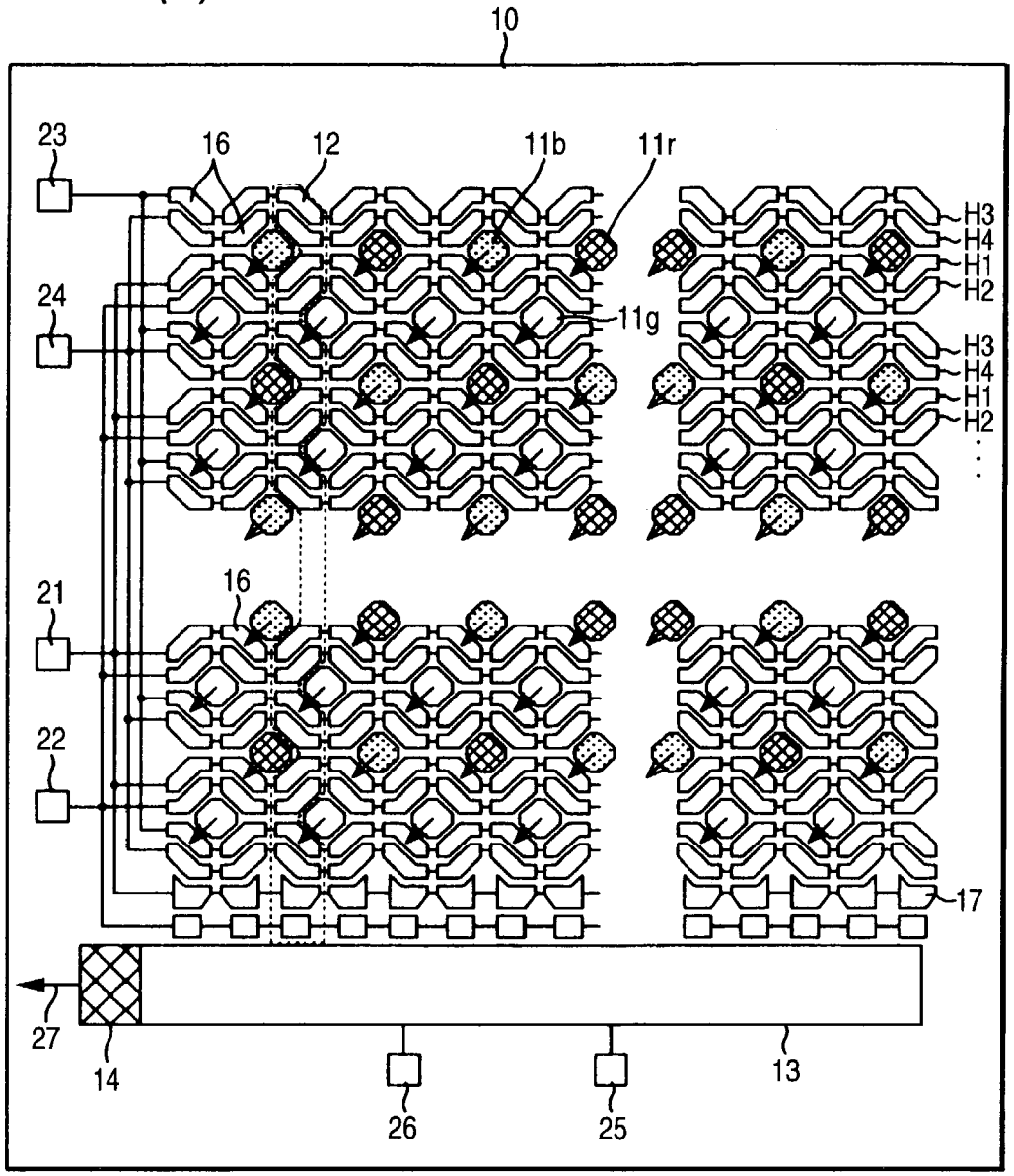
FIG. 9(a) is a schematic plan view showing a conventional solid-state image capturing device.
FIG. 9(b) is a view illustrating a transfer state in the conventional solid-state image capturing device.
Figure 9:
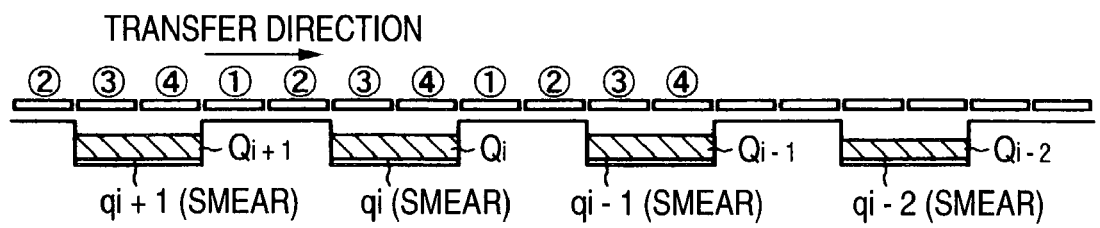
Figure 10:
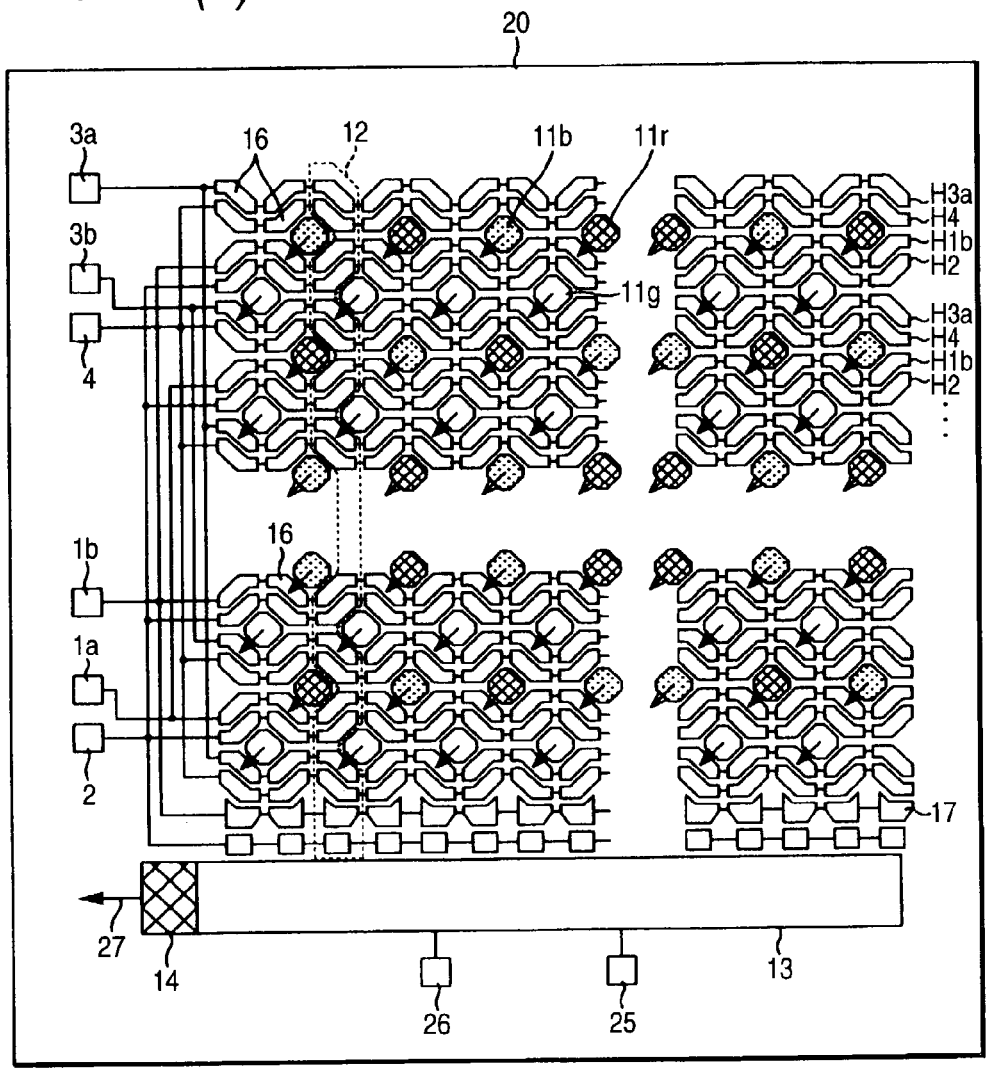
FIG. 10(a) is a schematic plan view showing a conventional solid-state image capturing device of an interlace scanning type.
FIG. 10(b) is a view illustrating a transfer state in FIG. 10(a).
Figure 10:
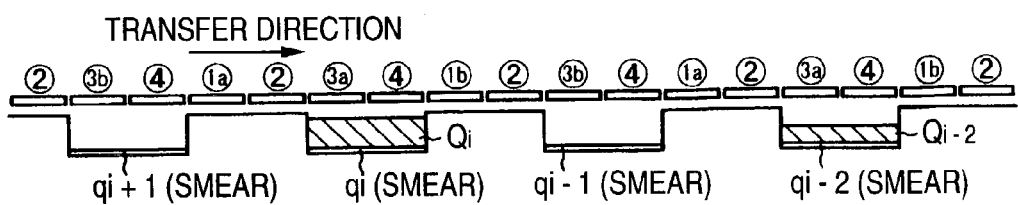

FIG. 2 is a schematic plan view showing the solid-state image capturing device illustrated in FIG. 1. The solid-state image capturing device 100 is almost the same as the solid-state image capturing device 10 described with reference to FIG. 9(a) and has different number of electrode terminals for applying a transfer potential (a transfer pulse) and different connecting structures thereof from those of the solid-state image capturing device 10.

In the embodiment, 16 electrode terminals 101 to 116 for applying a transfer potential to a vertical register 12 are provided in order to 16-phase drive the vertical register 12 and are connected to electrode groups H1 to H16 in a horizontal line, respectively. The electrode terminals 101 to 116 are connected to electrode groups H1 to H16 in which two lower figures of the reference numerals (numerals) of the electrode terminals are coincident with numerals after "H".

(x=1 to 2M) photoreceptors 11r, 11g and 11b are arranged in a transverse direction and are divided into N blocks in a vertical direction, and eight, that is, y=8N to 8N−7 photoreceptors are arranged in each block in the vertical direction.

Figure 3:
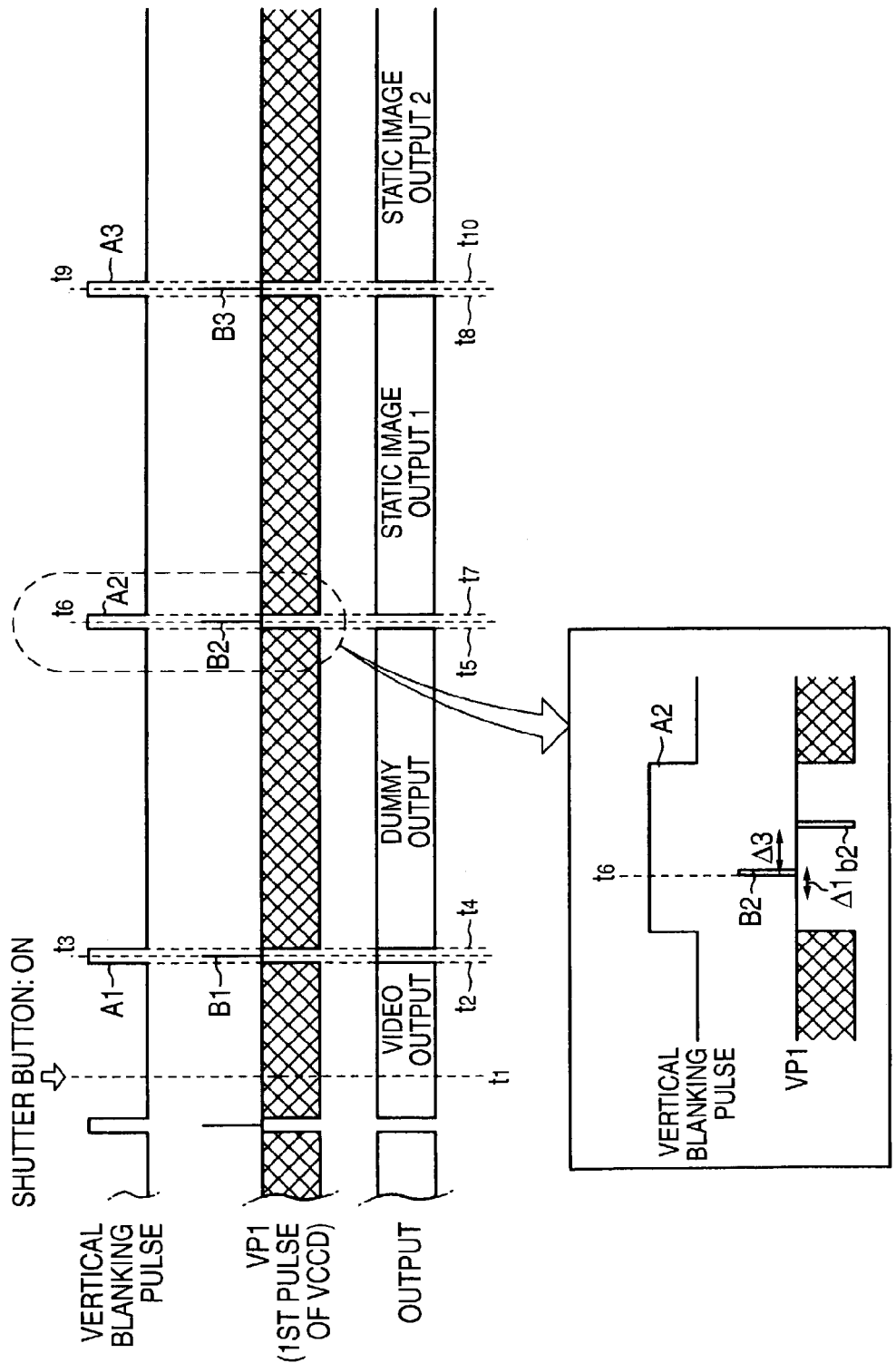
FIG. 3 is a timing chart showing the case in which continuous high-speed photographing is to be carried out by means of the digital still camera illustrated in FIG. 1.

FIG. 3 is a timing chart showing the case in which continuous high-speed photographing is carried out by a digital still camera. In the digital still camera, a high-speed shutter cannot be released by using a mechanical shutter. In the case in which the high-speed shutter is to be released as in the continuous high-speed photographing, therefore, an electronic shutter is used. In such a state that a shutter button is not released, a capturing image (a dynamic image) is displayed on an LCD display section (not shown) on the back face of the camera to act as a finder. Consequently, a vertical blanking pulse is generated at an interval of 1/30 to 1/60 second, for example, and the signal of the capturing image is fetched every 1/30 to 1/60 second.

When the shutter button is released (ON), a time interval between a vertical blanking pulse A1 obtained immediately thereafter and a next vertical blanking pulse A2 is 1/10 second, for example, and static images are fetched with fetching pulses B1 B2, B3 . . . generated in the vertical blanking pulses A1, A2, A3, . . . .

At this time, an image signal fetched with the first fetching pulse B1 is cancelled as a dummy output and an image signal fetched with the next fetching pulse B2 is output as the image signal of a static image. In FIG. 3, a time at which the fetching pulse B2 is generated is represented by t6, a timing in which a static image is output is represented by t7, and an end timing of the dummy output is represented by t5. In a portion shown in cross-hatching in the drawing, the ON/OFF state of a first-phase transfer pulse of the vertical register 12 is omitted.

Figure 4:
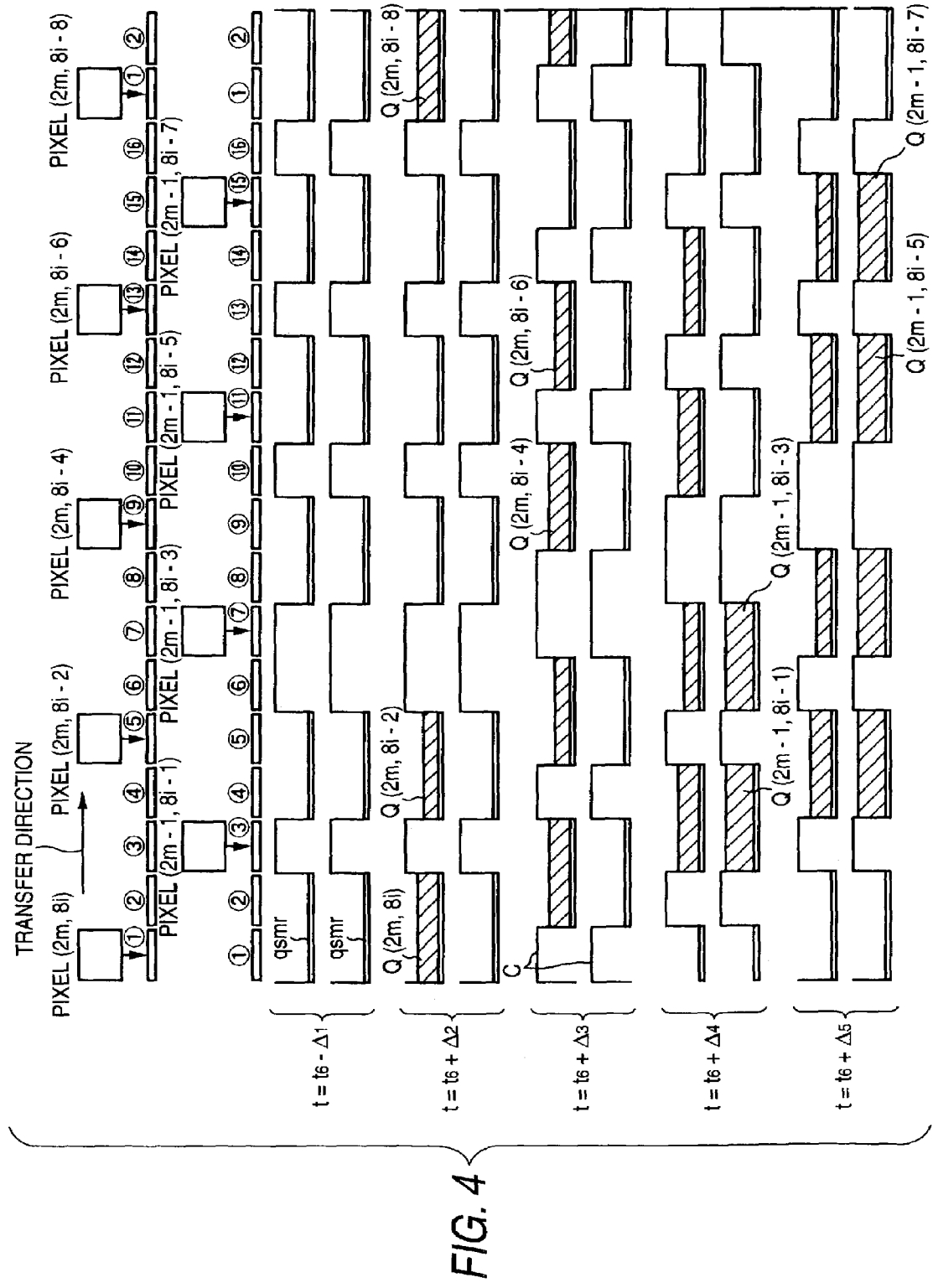
FIG. 4 is a timing chart illustrating electric charge read and transfer in the solid-state image capturing device shown in FIG. 1.

FIG. 4 is a timing chart illustrating electric charge read and transfer in the solid-state image capturing device 100 shown in FIG. 1. At a time of t=t6−Δ1 immediately before the time t6 shown in FIG. 3 (see an enlarged view of FIG. 3), only a smear charge qsmr is present in each vacant well. As shown in FIG. 4, the vacant well has two columns for the signal charge transfer (an upper stage) of the receptors 11r and 11b for a red color and a blue color and the signal charge transfer (lower stage) of the photoreceptor 11g for a green color.

At a time of t=t6+Δ2 immediately after the time t6, for example, a read pulse of +16V is applied to a read gate which is shared by ① and ⑤ electrodes and is not shown, and accepted charges Q(2m, 8i) and Q(2m, 8i−2) of pixels (2m, 8i) and (2m, 8i−2) are read and signal charges are transferred to corresponding electric potential wells, respectively. More specifically, the signal charges of odd-numbered photoreceptors in a transverse direction (for red and blue colors), that is, 0th and second photoreceptors in a vertical direction of each block in the photoreceptors 11r, 11g and 11b shown in FIG. 2 are transferred to a vacant well.

Next, the transfer of the vertical register 12 is carried out corresponding to one electrode. The transfer is an accordion transfer which will be described later. A pulse b2 of −8V (see the enlarged view of FIG. 3) is applied to the electrode terminal 101 (the ① electrode in FIG. 4). Consequently, an electric potential well in the ① electrode position (a state indicated as the designation C in FIG. 4) is eliminated.

At a time of t=t6+Δ3 (see the enlarged view of FIG. 3), for example, a read pulse of +16V is applied to electrodes ⑨ and (13) so that signal charges Q(2m, 8i−4) and Q(2m, 8i−6) of odd-numbered photoreceptors (for red and blue colors) in a transverse direction, that is, a fourth pixel (2m, 8i−4) and a sixth pixel (2m, 8i−6) in a vertical direction of each block are transferred to a vacant well.

Next, the transfer of the vertical register 12 is carried out corresponding to one electrode. At a time of t=t6+Δ4, subsequently, a read pulse is applied to electrodes ③ and ⑦ so that accepted charges Q(2m−1, 8i−1) and Q(2m−1, 8i−3) of pixels (2m−1, 8i−1) and (2m−1, 8i−3) are read and transferred to an electric potential well. More specifically, the signal charges of odd-numbered photoreceptors (for a green color) in the transverse direction, that is, first and third photoreceptors in the vertical direction of each block in the photoreceptors 11r, 11g and 11b shown in FIG. 2 are transferred to a vacant well.

At a time of t=t6+Δ5, similarly, a read pulse is applied to electrodes (11) and (15) so that signal charges Q(2m−1, 8i−5) and Q(2m−1, 8i−7) of pixels (2m−1, 8i−5) and (2m−1, 8i−7) are transferred to the electric potential well.

In this way, signal charges of a photoreceptor group corresponding to two lines for red, blue and green colors are moved to a horizontal line electrode group and are transferred along the vertical register 12. Moreover, a vacant well storing only smear charges every fifth electric potential wells is provided by interposing the electric potential well storing signal charges therebetween. By transferring only the smear charge, consequently, it is possible to carry out the smear correction of the signal charge based on the amount of the smear charges.

Figure 5:
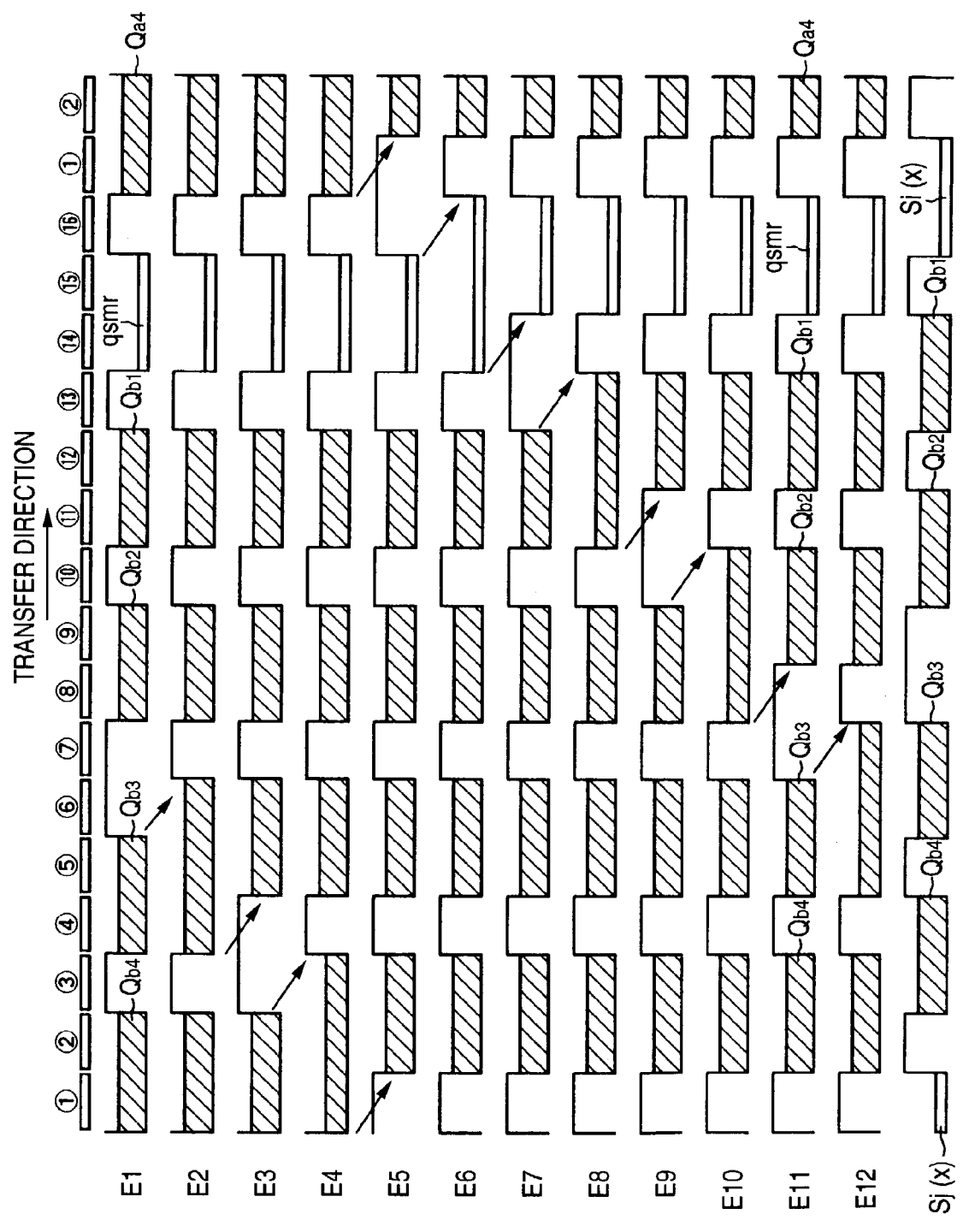
FIG. 5 is a timing chart showing the transfer order of a signal charge and a smear charge in the solid-state image capturing device illustrated in FIG. 1.

FIG. 5 is a timing chart showing a procedure for the accordion transferring the signal charge and the smear charge. FIG. 4 shows both an electric potential well for transferring the signal charges for a red color and a blue color and an electric potential well for transferring the signal charge for a green color. FIG. 5 shows only the transfer procedure. In FIG. 5, one of the electric potential wells is shown. Also in FIG. 5, when an electric potential having a low level (for example, −8 V) is a reference potential and an electrode potential has a high level (for example, 0 V), an electric potential well is formed in the corresponding electrode portion.

First of all, in a state indicated as a state E1, when the electric potential having a high level is applied to a ⑥ electrode, an electric potential well storing an electric charge Qb3 is expanded into three electrodes and is brought into a state E2. Next, a ④ electrode is set to have a low level to contract the electric potential well storing the electric charge Qb3 into two electrodes, and furthermore, the ③ electrode is set to be a high level potential so that an electric potential well storing an electric charge Qb4 is expanded into three electrodes. Thus, the transfer control is sequentially carried out so that each signal charge Q is transferred in the direction of a horizontal register 13.

Also in an electric potential well storing the smear charge qsmr, similarly, an electric potential having a high level is applied to a (16) electrode in a state E5 to be expanded into three electrodes (a state E6), and a (14) electrode is then set to be an electric potential having a low level and is thus contracted into two electrodes. Thus, the transfer control is repeated to transfer only the smear charge. Consequently, it is possible to detect only the amount of the smear charges. It is possible to correct a smear component mixed in the signal charge to obtain the amount of the signal charges having less smear in the same smear charge amount.

Next, an example of the smear correction will be described. While the amount of the smear charges in the vacant well which are transferred is detected, the same smear charge amount is detected as a voltage appearing in the vacant well. When a smear output signal voltage in the closest x column positioned on the downstream side of a pixel (x, y) is represented by si(x) (see the lowermost stage in FIG. 5) and a smear output signal voltage in the closest x column positioned on the upstream side of the pixel (x, y) is represented by sj(x), an estimated value S1(x,y) of the amount of the smear charges mixed in a signal charge in an optional position interposed therebetween is estimated in the following equation.

$$S1(x, y) = \{a \times si(x) + b \times sj(x)\}/(a+b)$$

wherein "a" represents the number of electric potential wells from a signal charge potential well of a pixel (x, y) to an electric potential well of sj(x), and "b" represents the number of electric potential wells from the signal charge potential well of the pixel (x, y) to the electric potential well of si(x).

The smear estimated value S1(x, y) mixed in the signal charge Qb1 shown in the lowermost stage of FIG. 5 is obtained as follows because of a=4 and b=1:

$$S1(x, y) = \{4 \times si(x) + 1 \times sj(x)\}/5.$$

In the case in which an upper bound value Sth2 and a lower bound value Sth1 are provided in the smear estimated value S1(x, y) and the smear estimated value S1(x, y) is equal to or lower than the lower bound value Sth1, the smear estimated value is set to be zero. By thus limiting the smear estimated value with the upper and lower bound values, it is possible to prevent an image corrected by the smear estimated value from being unnatural.

Next, the output of the pixel (x, y), that is, an image output signal voltage (for example, the output voltage of the electric charge Qb1 in the lowermost stage of FIG. 5) Vsig(x, y) is corrected by the smear estimated value S1(x, y). If an image signal voltage obtained after the correction is represented by Vsig'(x, y), the smear correction is carried out with $$V\text{sig}'(x, y) = V\text{sig}(x, y) - S1(x, y).$$

Consequently, it is possible to generate an image signal which is not influenced by the smear.

The smear correcting method is only illustrative and the smear correction can also be carried out by another method. For example, it is also possible to set $$V\text{sig}'(x, y) = V\text{th}1 \ldots \text{(in case of } V\text{sig}(x, y) \leq V\text{th}2\text{)}$$
and $$V\text{sig}'(x, y) = V\text{sig}(x, y) - S1(x, y) \ldots \text{(in other cases)}.$$

Herein, Vth1 represents a value approximating to the saturation voltage of a pixel and Vth2 is a value approximating to the saturation voltage of a vertical register, and Vth1<Vth2 is set. Moreover, when Vsig'(x, y) has a negative value, the values are set to be zero.

Figure 6:
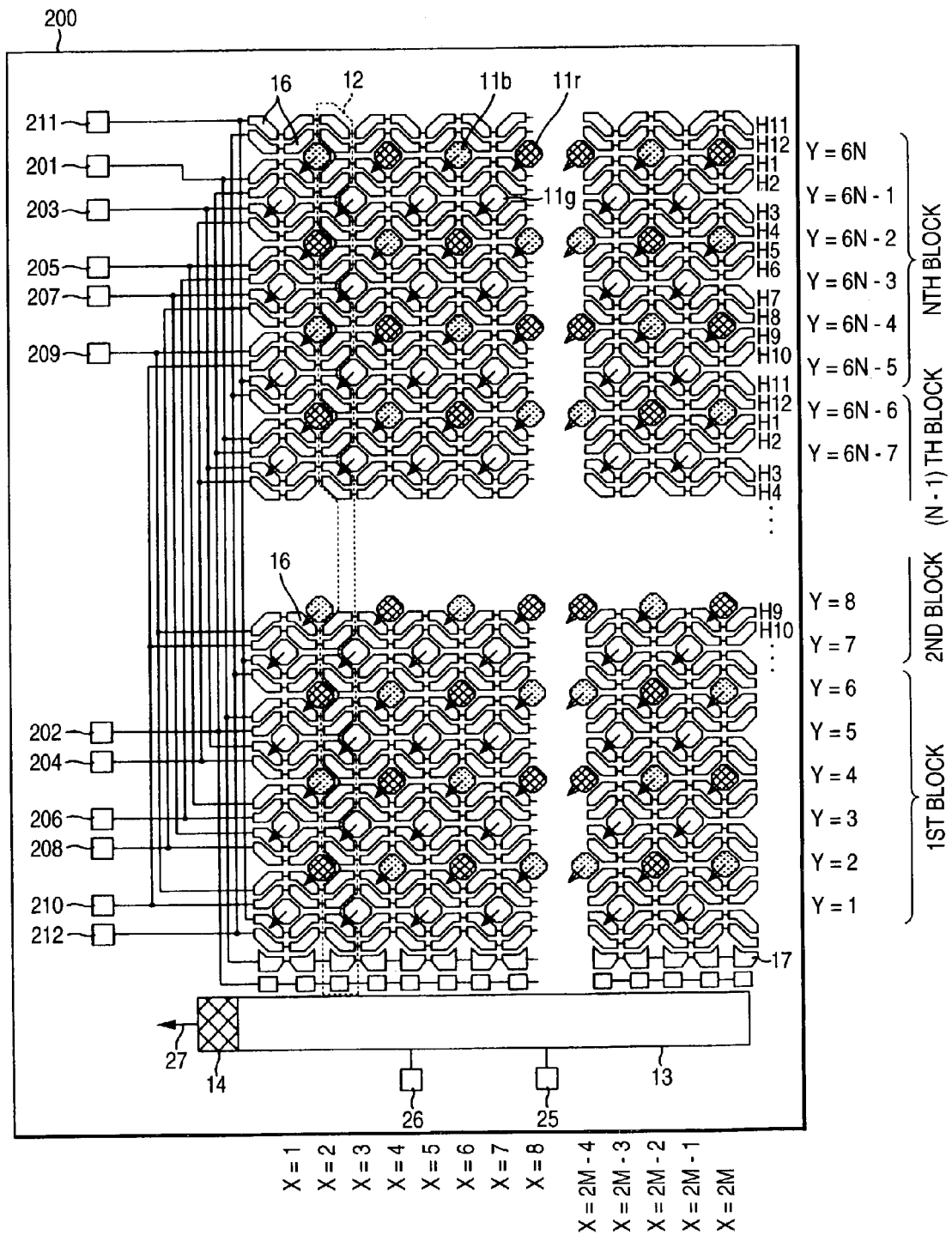
FIG. 6 is a schematic plan view showing a solid-state image capturing device according to a second embodiment of the invention.

FIG. 6 is a schematic plan view showing a solid-state image capturing device according to a second embodiment of the invention. A solid-state image capturing device 200 is almost the same as the solid-state image capturing device 100 according to the first embodiment (FIG. 2), and has the different number of electrode terminals to which a transfer potential is to be applied and different connecting structures thereof from those of the solid-state image capturing device 100.

In the embodiment, 12 electrode terminals 201 to 212 for applying a transfer potential to a vertical register 12 are provided in order to 12-phase drive the vertical register 12 and are connected to electrode groups H1 to H12 in a horizontal line, respectively. The electrode terminals 201 to 212 are connected to the electrode groups H1 to H12 in which two lower figures of the reference numerals (numerals) of the electrode terminals are coincident with numerals after "H".

(x=1 to 2M) photoreceptors 11r, 11g and 11b are arranged in a transverse direction and are divided into N blocks in a vertical direction, and six, that is, y=6N to 6N−5 photoreceptors are arranged in each block in the vertical direction.

Figure 7:
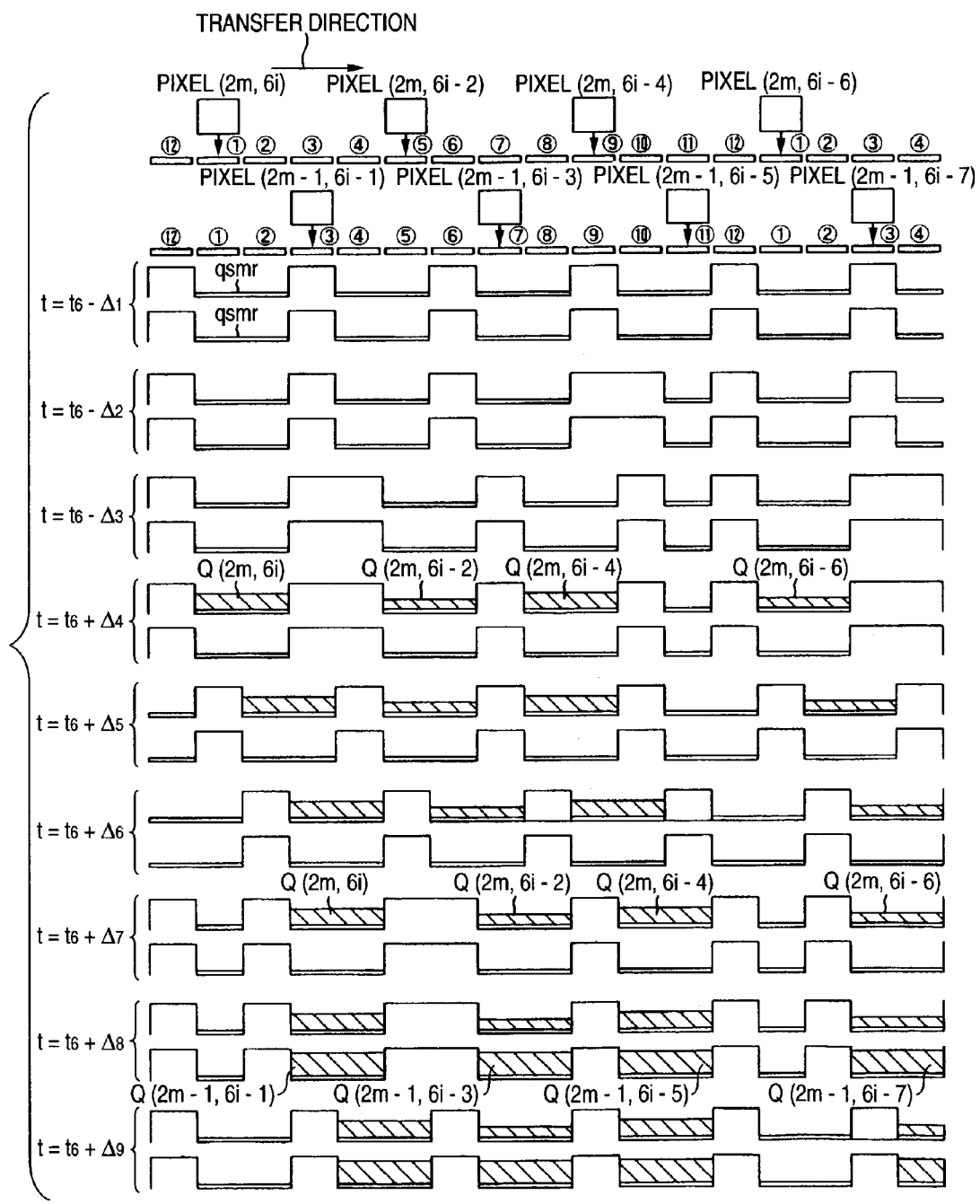
FIG. 7 is a timing chart showing electric charge read and transfer in the solid-state image capturing device illustrated in FIG. 6.
Figure 8:
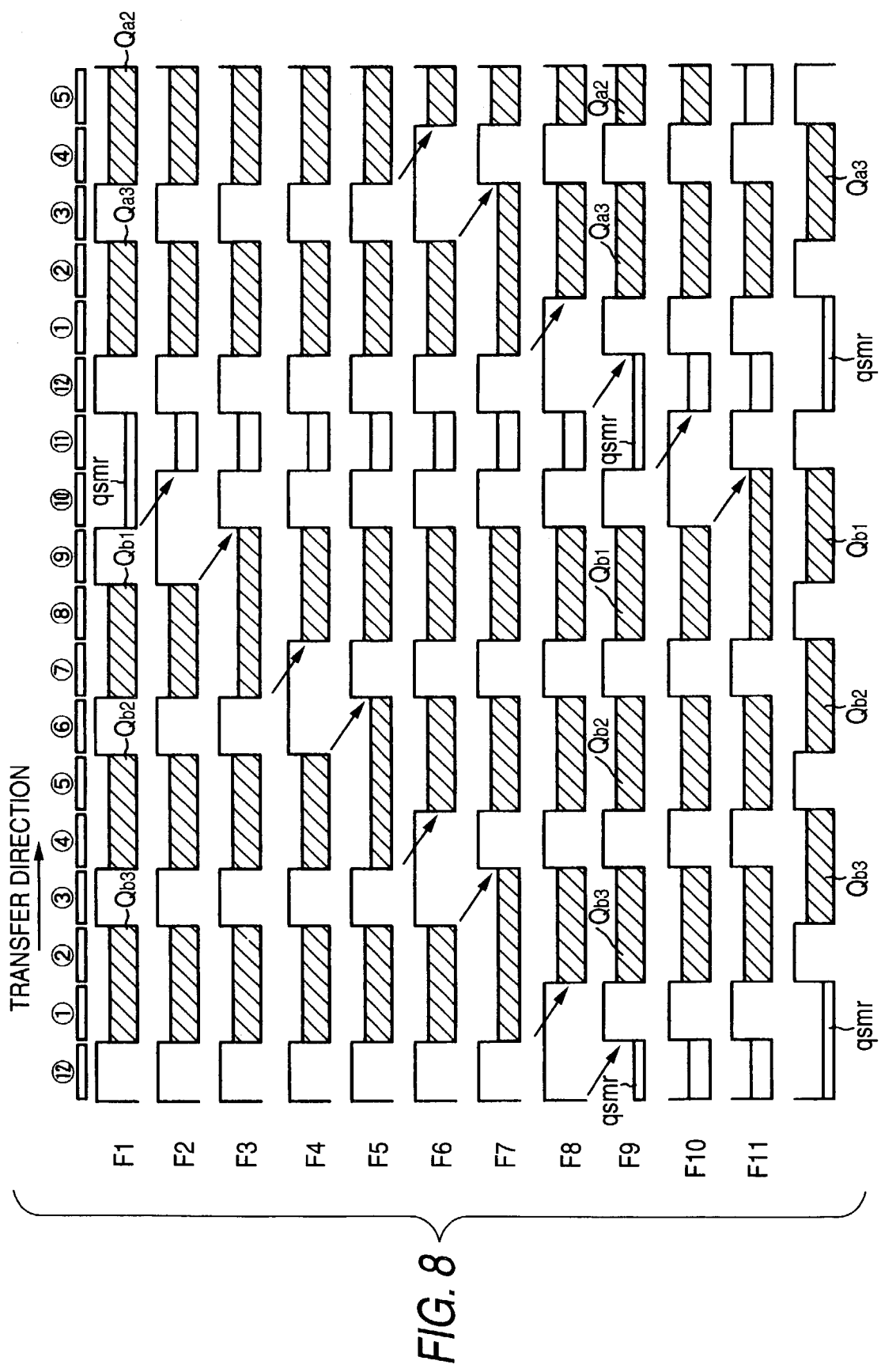
FIG. 8 is a timing chart showing the transfer order of a signal charge and a smear charge in the solid-state image capturing device illustrated in FIG. 6.

FIG. 7 is a timing chart illustrating electric charge read and transfer for 12-phase driving corresponding to FIG. 4 showing the 16-phase driving, and FIG. 8 is a timing chart illustrating a transfer procedure corresponding to FIG. 5 showing the 16-phase driving. Since a basic operation for the 12-phase driving is the same as that for the 16-phase driving, description thereof will be omitted.

An image signal for four lines is transferred corresponding to a smear signal for one line as shown in the lowermost stage of FIG. 5 in the 16-phase driving according to the first embodiment, while an image signal for three lines is transferred corresponding to the smear signal for one line as shown in the lowermost stage of FIG. 8, and a basic transfer procedure and a thinking way of smear correction are similar. In the second embodiment, there is an advantage that the number of transfer pulses and that of electrode terminals can be reduced to carry out a control more easily as compared with the first embodiment for the 16-phase driving.

As described above, in the case in which a high-speed shutter is to be released by an electronic shutter, the transfer of a vertical register is carried out with a mechanical shutter opened. Therefore, it is necessary to carry out the smear correction. In the case in which a low-speed shutter is released by the mechanical shutter, however, the transfer of the vertical register is carried out with the mechanical shutter closed. Therefore, the surfaces of the solid-state image capturing devices 100 and 200 are not exposed to an external light and the smear correction does not need to be carried out.

For this reason, it is also possible to employ such a structure that a digital still camera can select either a mode in which the smear correction according to the embodiments is carried out or a mode in which the smear correction is not carried out, thereby picking up an object image. In this case, the mode can be selected manually or automatically interlockingly with the operation of the mechanical shutter.

According to each of the embodiments, it is possible to transfer only a vacant well having a smear charge to a vertical CCD register, thereby detecting the smear charge. Therefore, a smear component mixed in a signal charge can easily be corrected. Consequently, it is possible to obtain an excellent image having smear reduced.

While a high-speed sweeping operation to be usually carried out immediately before a signal charge for a static image is read from a pixel array to the vertical CCD register has been omitted in the embodiments, it is apparent that the high-speed sweeping operation maybe carried out. The high-speed sweeping operation is carried out between times t5 and t6 and between times t8 and t9 in FIG. 3, for example. The high-speed sweeping operation is carried out by transmitting a transfer pulse (the 16-phase transfer pulse in the first embodiment and the 12-phase transfer pulse in the second embodiment) at a high speed during these times.

Moreover, while there has been described the case in which the high-speed shutter is to be released or the case in which the continuous high-speed photographing is to be carried out in the embodiments, the invention can be applied to photographing for a dynamic image in addition to photographing for a static image, and furthermore, the invention can be applied to a video camera and a monitoring camera in addition to the still camera.

Furthermore, while the progressive scanning type CCD area image sensor has been described as an example in the embodiments, the invention can also be applied to the interlace scanning type. In this case, the number of read lines in a vertical direction during continuous high-speed photographing is set to be the number of read lines in one field for normal reading. Moreover, while the invention has been applied to the CCD image sensor having a pixel array which is referred to as a so-called honeycomb type in the embodiments, the invention can also be applied to a CCD area image sensor in which a pixel array is set to be a tetragonal grid array.

Moreover, while the interline transfer type CCD area image sensor has been described as an example in the embodiments, the invention can also be applied to a frame interline transfer type CCD area image sensor. In this case, it is sufficient that the vertical CCD register of a photosensing section carries out 16-phase driving or 12-phase driving and the vertical CCD register of a storage section (a memory section) carries out 4-phase driving.

Furthermore, while the 4-phase driving vertical CCD register is set to carry out multiphase driving (16 phases and 12 phases) as a basic structure in the embodiments, the basic structure can be set to a 3-phase driving vertical CCD register to carry out multiphase driving (12 phases and 9 phases) in order to put only the smear charges in a vacant well and to thus transfer them.

According to the invention, only the smear charge can be detected. Therefore, it is possible to easily correct a smear component mixed in a signal charge. Consequently, it is possible to obtain an excellent image having smear reduced.

What is claimed is:

1. A solid-state image capturing device, comprising:
   a pixel array arranged in a row direction and a column direction which is orthogonal thereto;
   a vertical register including a plurality of transfer electrodes in which a signal charge generated by light acceptance of each pixel is read and is sequentially transferred in the column direction upon receipt of a transfer pulse;
   a horizontal register for receiving the signal charge transferred by the vertical register and transferring the signal charge in a horizontal direction; and
   an output section for outputting the signal charge transferred by the horizontal register,
   wherein a first set of electrode terminals for generating continuously a plural K electric potential wells (K is an integer of not less than 2) storing signal charges in the vertical register upon receipt of the transfer pulse, and a second set of electrode terminals for generating a smear electric potential well storing a smear charge are provided as electrode terminals for cyclically transmitting the transfer pulse to each of the transfer electrodes, said smear electric potential well being arranged after said plural K electric potential wells, and wherein at least one transfer electrode is configured to receive, from a corresponding photoreceptor of the pixel array, both signal charges and smear charges, wherein the smear charges from the corresponding photoreceptor are received in isolation from the signal charges.

2. The solid-state image capturing device according to claim 1, further comprising selecting means for switching a first mode in which the signal charges are transferred by means of the vertical register after the smear electric potential well storing the smear charge is generated, and a second mode in which the signal charges are transferred by means of the vertical register without generating the smear electric potential well.

3. The solid-state image capturing device according to claim 1, wherein the solid-state image capturing device is an interline transfer type CCD area image sensor or a frame interline transfer type CCD area image sensor.

4. The solid-state image capturing device according to claim 1, wherein the pixel array is arranged like a tetragonal grid or a honeycomb.

5. The solid-state image capturing device according to claim 1, wherein each line of photoreceptors of the pixel array is shifted by a half pitch with an adjacent line of photoreceptors.

6. The solid-state image capturing device according to claim 1, wherein the electrode terminals are grouped to provide a 16-phase drive signal or a 12-phase drive signal to the plurality of transfer electrodes.

7. The solid-state image capturing device according to claim 6, wherein the signal charges from all photoreceptors of the pixel array are transferred simultaneously in the vertical register through the 16-phase drive signal or the 12-phase drive signal.

8. The solid-state image capturing device according to claim 1, wherein a plurality of transfer electrodes are configured to receive, from a corresponding plurality of photoreceptors of the pixel array, both the signal charges and the smear charges, wherein the smear charges from the corresponding plurality of photoreceptors are received in isolation from the signal charges.

9. The solid-state image capturing device according to claim 1, wherein the number of said plural K electric potential wells and said smear electric potential well is greater than the number of photoreceptors of the pixel array.

10. A smear correcting method for a solid-state image capturing device, comprising:

reading signal charges from a pixel array arranged in a row direction and a column direction orthogonal to the row direction to a vertical register including a plurality of transfer electrodes upon receipt of a transfer pulse, wherein the signal charge of each pixel is generated by light acceptance of each pixel;

receiving the signal charges transferred to the vertical register and transferring the signal charge in a horizontal direction to a horizontal register;

outputting the signal charges transferred from the horizontal register; and estimating a correction of a smear component in the signal charges transferred from a plural K (K is an integer of not less than 2) electric potential wells from a smear charge amount that is transferred from a smear electric potential well for a smear charge, wherein the reading step comprises applying voltages to a first set of electrode terminals for generating continuously the plural K electric potential wells storing the signal charges in the vertical register upon receipt of the transfer pulse, and applying voltages to a second set of electrode terminals for generating the smear electric potential well storing the smear charge, wherein the first and second electrode terminals are provided for cyclically transmitting the transfer pulse to each of the transfer electrodes, said smear electric potential well being arranged after said plural K electric potential wells, and wherein the reading step further comprises detecting the signal charges using at least one photoreceptor of the pixel array and detecting the smear charges in isolation from detecting the signal charges using the same at least one photoreceptor.

11. The smear correcting method for the solid-state image capturing device according to claim 10, wherein each signal charge in the signal charges stored in the plural K electric potential wells, which is interposed between said smear electric potential well and another smear electric potential well being arranged after another set of plural K electric potential wells, is corrected by calculating a weighted average of smear charge amounts of both the smear electric potential wells.

12. The smear correcting method of the solid-state image capturing device according to claim 10, further comprising applying a 16-phase drive signal or a 12-phase drive signal to the plurality of transfer electrodes via the electrode terminals of the solid-state image capturing device.

13. The smear correcting method of the solid-state image capturing device according to claim 12, wherein the signal charges from all photoreceptors of the pixel array are transferred simultaneously in the vertical register through the 16-phase drive signal or the 12-phase drive signal.

14. The smear correcting method for a solid-state image capturing device according to claim 10, wherein the number of said plural K electric potential wells and said smear electric potential well is greater than the number of photoreceptors of the pixel array.

15. The smear correcting method of the solid-state image capturing device according to claim 10, wherein the reading step further comprises detecting the signal charges and the smear charges in isolation from detecting the signal charges using a plurality of photoreceptors of the pixel array.

16. A digital still camera, comprising:

a solid-state image capturing device;

an optical system for forming an object image in the solid-state image capturing device;

a signal processing section for processing a signal output from the output section of the solid-state image capturing device and generating an image;

a memory section for recording the image thus generated, and a smear correcting section for correcting the signal charge, wherein said solid-state image capturing device further comprising:

a pixel array arranged in a row direction and a column direction which is orthogonal thereto;

a vertical register including a plurality of transfer electrodes in which a signal charge generated by light acceptance of each pixel is read and is sequentially transferred in the column direction upon receipt of a transfer pulse;

a horizontal register for receiving the signal charge transferred by the vertical register and transferring the signal charge in a horizontal direction; and an output section for outputting the signal charge transferred by the horizontal register, wherein a first set of electrode terminals for generating continuously a plural K electric potential wells (K is an integer of not less than 2) storing signal charges in the vertical register upon receipt of the transfer pulse, and a second set of electrode terminals for generating a smear electric potential well storing a smear charge are provided as electrode terminals for cyclically transmitting the transfer pulse to each of the transfer electrodes, said smear electric potential well being arranged after said plural K electric potential wells, and wherein at least one transfer electrode is configured to receive, from a corresponding photoreceptor of the pixel arrays, both signal charges and smear charges, wherein the smear charges from the corresponding photoreceptor are received in isolation from the signal charges.

17. The digital still camera according to claim 16, said digital still camera further comprising:

an electronic shutter for shielding electronically a light of the optical system;

a mechanical shutter for shielding mechanically a light of the optical system; and control means for controlling the signal processing section to generate an image from the signal charges obtained in such a way that said signal charges are not corrected by the smear correcting section when using the mechanical shutter, while said signal charges are corrected by the smear correcting section when using the electronic shutter without using the mechanical shutter.

18. The digital still camera according to claim 17, further comprising control means for outputting a transfer pulse to sweep an unnecessary signal charge in the vertical register of the solid-state image capturing device at a high speed immediately before the signal charge is read from the pixel array to the transfer electrode constituting the vertical register.

19. The digital still camera according to claim 16, further comprising control means for outputting a transfer pulse to sweep an unnecessary signal charge in the vertical register of the solid-state image capturing device at a high speed immediately before the signal charge is read from the pixel array to the transfer electrode constituting the vertical register.

20. The digital still camera according to claim 16, wherein the smear correcting section is configured to estimate a correction of a smear component in the signal charges transferred from the plural K electric potential wells from a smear charge amount that is transferred from the smear electric potential well for the smear charge.

21. The digital still camera according to claim 20, wherein each signal charge in the signal charges stored in the plural K electric potential wells, which is interposed between said smear electric potential well and another smear electric potential well being arranged after another set of plural K electric potential wells, is corrected by the smear correcting section by calculating a weighted average of smear charge amounts of both the smear electric potential wells.

22. The digital camera according to claim 16, wherein each line of photoreceptors of the pixel array is shifted by a half pitch with an adjacent line of photoreceptors.

23. The digital camera according to claim 16, wherein the electrode terminals are grouped to provide a 16-phase drive signal or a 12-phase drive signal to the plurality of transfer electrodes.

24. The digital camera according to claim 23, wherein the signal charges from all photoreceptors of the pixel array are transferred simultaneously in the vertical register through the 16-phase drive signal or the 12-phase drive signal.

25. The digital camera according to claim 16, wherein a plurality of transfer electrodes are configured to receive, from a corresponding plurality of photoreceptors of the pixel array, both the signal charges and the smear charges, wherein the smear charges from the corresponding plurality of photoreceptors are received in isolation from the signal charges.

26. The digital still camera according to claim 16, wherein the number of said plural K electric potential wells and said smear electric potential well is greater than the number of photoreceptors of the pixel array.

27. A solid-state image capturing device, comprising:

a pixel array arranged in a row direction and a column direction which is orthogonal thereto;

a vertical register including a plurality of transfer electrodes in which a signal charge generated by light acceptance of each pixel is read and is sequentially transferred in the column direction upon receipt of a transfer pulse;

a horizontal register for receiving the signal charge transferred by the vertical register and transferring the signal charge in a horizontal direction;

an output section for outputting the signal charge transferred by the horizontal register;

a plurality of electrode terminals, connected to the plurality of transfer electrodes of the vertical register, configured to create a plurality of electric potential wells in the plurality of transfer electrodes, wherein a number of potential wells created in the plurality of transfer electrodes exceeds a total number of photoreceptors the pixel array, wherein the plurality of electrode terminals are configured to transfer smear charges from the plurality of photoreceptors of the pixel array to the plurality of electric potential wells in response to a fetching pulse, wherein the plurality of electrode terminals are configured to transfer signal charges from the plurality of photoreceptors of the pixel array to the plurality of electric potential wells and to transfer the signal charges in the plurality of electric potential wells to the horizontal register in response to a multiphase signal, and wherein after one cycle of the multiphase signal is applied to the plurality of electrode terminals after the fetching pulse is applied, signal charges from all photoreceptors are transferred to the plurality of electric potential wells and one or more of the plurality of electric potential wells carry only the smear charges.

28. The solid-state image capturing device according to claim 27, wherein one or one or more photoreceptors of the pixel array used to read smear charges are also used to read signal charges.

29. The solid-state image capturing device according to claim 27, wherein the multiphase signal comprises a plurality of read pulses and a plurality of transfer pulses applied to the plurality of electrode terminals, wherein for each read pulse, signal charges from a subset of the photoreceptors are transferred to a corresponding subset of electric potential wells, and wherein a transfer pulse follows each read pulse to cause the electric potential wells to move towards the horizontal register.

30. The solid-state image capturing device according to claim 29, wherein the multiphase signal is a 12-phase or a 16-phase signal.

31. A solid-state image capturing device, comprising:

a pixel array arranged in a row direction and a column direction which is orthogonal thereto;

a vertical register including a plurality of transfer electrodes in which a signal charge generated by light acceptance of each pixel is read and is sequentially transferred in the column direction upon receipt of a transfer pulse;

a horizontal register for receiving the signal charge transferred by the vertical register and transferring the signal charge in a horizontal direction;

an output section for outputting the signal charge transferred by the horizontal register; and a plurality of electrode terminals, connected to the plurality of transfer electrodes of the vertical register, configured to create a plurality of electric potential wells in the plurality of transfer electrodes to receive a plurality of signal charges from a plurality of photoreceptors of the pixel array, wherein a number of potential wells created in the plurality of transfer electrodes exceeds a total number of photoreceptors the pixel array, wherein the excess electric potential wells are configured to transport only smear charges from one or more photoreceptors of the pixel array to the horizontal register, and wherein the one or more photoreceptors of the pixel array used to provide the smear charges to the excess electric potential wells are also used to provide signal charges to one or more potential wells that receive the signal charges.

32. The solid-state image capturing device according to claim 31, wherein each of the plurality of electrode terminals is configured to provide one phase of a multiphase driving signal.

33. The solid-state image capturing device according to claim 32, wherein the pixel array comprises a plurality of pixel blocks, wherein each pixel block comprises a plurality of rows of pixels, wherein a number of rows is even, wherein pixels of even rows comprise a plurality of red sensitive photoreceptors alternating with a plurality blue sensitive photoreceptors, wherein pixels of odd rows comprise a plurality of green sensitive photoreceptors, wherein the pixels of even rows of the block are shifted by half pitch in both row and column directions from the pixels of odd rows of the block such that pixels of even columns comprise a plurality of red sensitive photoreceptors alternating with a plurality blue sensitive photoreceptors and pixels of odd columns comprise a plurality of green sensitive photoreceptors, wherein each column of the block includes a subset of transfer electrodes configured to receive signal charges or smear charges or both from a corresponding column of photoreceptors for transfer to the horizontal register, wherein a number of transfer electrodes in the subset is equal to a number of phases of the multiphase signal, and wherein each transfer electrode of the subset is configured to receive one phase of the multiphase signal.

34. The solid-state image capturing device according to claim 33, wherein a sufficient number of electric potential wells are created within the subset of transfer electrodes to transfer the signal charges from the corresponding column of photoreceptors and at least one excess electric potential well to transfer a smear charge only.

* * * * *